United States Patent
Tayebati

[11] Patent Number: 6,041,071
[45] Date of Patent: *Mar. 21, 2000

[54] ELECTRO-OPTICALLY TUNABLE EXTERNAL CAVITY MIRROR FOR A NARROW LINEWIDTH SEMICONDUCTOR LASER

[75] Inventor: Parviz Tayebati, Watertown, Mass.

[73] Assignee: CoreTek, Inc., Burlington, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/726,049

[22] Filed: Sep. 27, 1996

Related U.S. Application Data

[60] Provisional application No. 60/004,620, Sep. 29, 1995, and provisional application No. 60/004,940, Oct. 4, 1995.

[51] Int. Cl.[7] .................................................. H01S 3/03
[52] U.S. Cl. .............................. 372/64; 372/20; 372/96; 372/23
[58] Field of Search ................................ 372/64, 20, 96, 372/23

[56] References Cited

U.S. PATENT DOCUMENTS

| | | | |
|---|---|---|---|
| 5,022,038 | 6/1991 | Bradlay | 372/20 |
| 5,418,802 | 5/1995 | Chwalck | 372/20 |
| 5,541,945 | 7/1996 | Yamaguchi et al. | 372/20 |
| 5,617,435 | 4/1997 | Nagai et al. | 372/20 |
| 5,644,584 | 7/1997 | Nam et al. | 372/20 |

OTHER PUBLICATIONS

Marx et al., "Low–loss strain induced optical waveguides in strontium barium niobate ($Sr_{0.6}$ $Ba_{0.4}$ $Nb_2$ $O_6$) at 1.3 $\mu$m wavelength", Appl. Phys. Lett., vol. 66, No. 3, pp. 274–276, 1995 American Institute of Physics.

R.C. Alferness et al., "Vertically Coupled InGaAsP/InP Buried Rib Waveguide Filter", Appl. Phys. Lett. 59 (20), American Institute of Physics, Nov. 11, 1991, pp. 2573–2575.

F. Heismann et al., "Narrow–Linewidth, Electro–Optically Tunable InGaAsP-Ti: $LiNbO_3$ Extended Cavity Laser", Appl. Phys. Lett., vol. 51, No. 3, American Institute of Physics, Jul. 20, 1987, pp. 143–145.

V. Jayaraman et al., "Extended Tuning Range In Sampled Grating DBR Lasers", IEEE Photonics Technology Letters, vol. 5, No. 5, May 1993, pp. 489–491.

*Primary Examiner*—Leon Scott, Jr.
*Attorney, Agent, or Firm*—Pandiscio & Pandiscio

[57] ABSTRACT

An external cavity mirror for use in a semiconductor laser, the external cavity mirror comprising a waveguide formed on a substrate of highly electro-optic material, and including electrically-operated means for determining the reflectance attributes of the external cavity mirror.

26 Claims, 11 Drawing Sheets

ELECTRO-OPTICALLY TUNABLE EXTERNAL CAVITY MIRROR FOR A NARROW LINEWIDTH SEMICONDUCTOR LASER

REFERENCE TO PENDING PRIOR PROVISIONAL PATENT APPLICATIONS

This patent application claims benefit of pending prior U.S. Provisional patent application Ser. No. 60/004,620, filed Sep. 29, 1995 by Parviz Tayebati for AGILE, WIDELY TUNABLE DIODE LASER WITH NARROW LINEWIDTH; and pending prior U.S. Provisional patent application Ser. No. 60/004,940, filed Oct. 4, 1995 by Parviz Tayebati for WIDELY TUNABLE, MINIATURE SINGLE MODE DIODE LASER ARRAYS WITH NARROW LINEWIDTH.

FIELD OF THE INVENTION

The present invention relates to the field of semiconductor lasers in general, and more particularly to external cavity devices used in connection with semiconductor lasers to control and modify the output of such lasers.

BACKGROUND OF THE INVENTION

Controlling the spectral output of a diode laser through the use of an external component is well known in the art. Typically, a wavelength (or frequency) selective element is positioned in optical communication with the optically active (gain) region of the laser so as to select a specific wavelength from the output spectrum of the laser. Once an appropriate wavelength is selected, light of this wavelength is redirected back to the active (gain) region of the laser so as to provide the positive feedback required for laser action. Wavelength (or frequency) selective elements of this type often function by exhibiting very low losses at a selected emission wavelength and exhibiting very high losses at all other wavelengths.

It will be appreciated that, for most semiconductor lasers, the output spectrum does not resemble a spontaneous emission lineshape, but rather consists of a plurality of regularly spaced, narrower lines corresponding to the various resonant (high Q) frequencies and spatial modes of the laser cavity. Thus it will be understood that various prior art external cavity devices have been developed to select a single frequency and fundamental mode from among the plurality of frequencies and modes generated by a typical diode laser.

For example, in one prior art device, the light from a diode laser is directed toward an external cavity comprising a diffraction grating. In this type of device, the various wavelengths emitted by the laser are first dispersed by the grating, and then light of a selected frequency is retro-reflected back into the laser. Thus, by varying the characteristics of the diffraction grating, a preferred laser oscillation wavelength, corresponding to perfect retro-reflection, may be selected and redirected back into the diode laser for further stimulation at that wavelength. Unfortunately, while such prior art external cavity diffraction gratings allow for relatively wide wavelength tuning, e.g., 50 nm (nanometers) at 1550 nm, and relatively narrow linewidth, e.g., less than 1 Mhz (megahertz), they are typically not well suited to miniaturization or to integration into commercially available semiconductor lasers. Such prior art devices also tend to suffer from very slow response times, e.g., approximately 1 ms (millisecond).

Electro-optical filtering devices (including $LiNbO_3$ waveguides, semiconductor band filling devices, and the like) have also been employed for the selection of the laser oscillation wavelength. However, these devices generally possess insufficient non-linearity for wide wavelength tuning, often having tuning ranges of only about 5 nm or so.

Another well known device used to select the laser oscillation frequency is a three-section tunable distributed Bragg reflector (DBR) in an external cavity. A DBR is somewhat similar to a diffraction grating, but it does not include the dispersive elements found in conventional diffraction gratings. As with other wavelength selection devices, DBR's are often designed to reflect a specific laser oscillation wavelength with maximum efficiency. The DBR, however, acts as a band-pass mirror with extremely sharp resonance. More particularly, when such a reflector is used with a typical semiconductor laser, one of the laser's mirrors is replaced by a corrugated waveguide, i.e., the DBR grating. The periodicity and material of the corrugations are selected so as to provide a sinusoidally-varying effective index of refraction along the direction of propagation of the guided light wave. In this way, when the wavevector of the guided light wave is an integer multiple of the grating wavevector, the guided wave of light is strongly reflected. On the other hand, when the wavevector of the guided light wave is a non-integer multiple of the grating wavevector, the guided wave of light will propagate freely through the device and not be redirected back to the optically active (gain) region of the laser. Of course, it will be appreciated that the spatial modes of the laser are also a factor in DBR-controlled wavelength selection.

Unfortunately, while prior art DBR's of the type disclosed above are generally susceptible to miniaturization, and while they frequently exhibit relatively fast response times, e.g., approximately 0.5 nm/ns (nanometers/nanosecond), they are also generally not widely tunable. Prior art DBR's also often exhibit a tuning range on the order of only about 4 nm or so. This narrow tuning range is generally due to the reliance on injection-induced index changes, i.e., band filling. Also, prior art DBR's often cause sudden discrete shifting (or "hopping") between the spatial modes of the laser.

Another prior art wavelength selection device comprises a grating-assisted vertical cavity coupling. This device provides for a wide tuning range by employing small optical non-linearities in its structure and by employing a long grating period. The grating-assisted vertical cavity switches the cavity mode between two intercavity waveguides that are coupled by a carrier-injected grating so as to allow relatively broad tuning, e.g., approximately 70 nm at 1.5 microns. However, this relatively wide tuning range is achieved at the cost of poor emission linewidth, or poor modal stability, or both. In particular, because of the long grating period employed by the device, at a 50 nm tuning range, linewidths of approximately 20 Angstroms or 340 GHz (gigahertz) are often produced. It will be appreciated that, in general, all such "carrier-injected" techniques tend to suffer from linewidth broadening during tuning because of shot noise. As a result, most prior art external cavity tuning devices which provide wide tuning ranges do so at the expense of broader linewidths.

As a consequence, there is a need for a miniature external cavity tuning device which operates at high speed, is dynamically tunable over a broad range of wavelengths, and does not introduce appreciable linewidth broadening or mode hopping.

OBJECTS OF THE INVENTION

Accordingly, one object of the present invention is to provide a novel external cavity tuning element that is adapted for dynamically tuning a commercially available diode laser over a wide range of wavelengths without appreciable linewidth broadening.

Another object of the present invention is to provide a novel external cavity tuning element which is adapted for very fine tuning of the output light of a commercially available diode laser through the use of the linear or the quadratic electro-optic effect.

And another object of the present invention is to provide a novel external cavity tuning element comprising a highly electro-optic substrate.

Another object of the present invention is to provide a novel external cavity tuning element comprising a ferroelectric electro-optical material, e.g., $Sr_xBa_{(1-x)}Nb_2O_6$ (SBN), $Pb_{(1-x)}La_x(Ti_{(1-y)}Zr_y)_{(1-(x/4))}O_3$ (PLZT), $LiNbO_3$, $LiTaO_3$, $BaTiO_3$, etc.

Still another object of the present invention is to provide a novel tunable external cavity waveguide that comprises a mechanical strain-induced refractive index profile that is suitable for tuning laser light.

A further object of the present invention is to provide a novel electro-optically tunable distributed Bragg reflector (DBR) that is dynamically tunable over a wide range of wavelengths, but without appreciable linewidth broadening or mode hopping.

A still further object of the present invention is to provide for the electro-optical tuning of both the lasing wavelength and the spatial mode of a commercially available diode laser by applying an external voltage difference across an external cavity waveguide fabricated from a highly electro-optic substrate.

And a further object of the present invention is to provide a novel external cavity tuning element for electro-optically tuning a commercially available diode laser in the 650–2000 nm range so as to yield a narrow linewidth, electrically-controllable output wavelength.

Another object of the present invention is to provide a novel external cavity tuning element having tuning speeds of about 1 nm/ns, with a tunability range of about +/−90 nm and a linewidth of around 3 MHz.

Still another object of the present invention is to provide a novel external cavity tuning element adapted for tuning a commercially available diode laser, the fabrication of which is fully compatible with standard semiconductor processing techniques.

Another object of the present invention is to provide a novel hybrid semiconductor laser having an external cavity tuning element fabricated from a ferroelectric electro-optical material.

And another object of the present invention is to provide a novel external cavity tuning element comprising a distributed Bragg reflector (DBR) fabricated on a ferroelectric electro-optical material.

Yet another object of the present invention is to provide a novel hybrid semiconductor laser having an external cavity tuning element fabricated from $Sr_xBa_{(1-x)}Nb_2O_6$ (SBN).

And another object of the present invention is to provide a novel semiconductor laser having a tunable external cavity waveguide fabricated from SBN:61 and having an electro-optic coefficient of $r_{33}$=400 pm/V (picometers/volt).

Still another object of the present invention is to provide a novel semiconductor laser having a tunable external cavity waveguide fabricated from SBN:75 and having an electro-optic coefficient of $r_{33}$=1340 pm/V.

And another object of the present invention is to provide a novel semiconductor laser having a tunable external cavity waveguide fabricated from $Pb_{(1-x)}La_x(Ti_{(1-y)}Zr_y)_{(1-(x/4))}O_3$ (PLZT)

And another object of the present invention is to provide a novel external cavity waveguide wherein the waveguide is fabricated from a substrate having an electro-optic coefficient of no less than $r_{33}$=240 pm/V and a strain-optic coefficient which is positive.

A further object of the present invention is to provide a novel method for making a new tunable semiconductor laser.

And another object of the present invention is to provide a novel method for operating a semiconductor laser.

SUMMARY OF THE INVENTION

These and other objects of the present invention are achieved through the provision and use of a novel tunable external cavity waveguide adapted for tuning a semiconductor laser, the waveguide comprising a ferroelectric electro-optical substrate, means for creating a waveguide in said substrate, and means for determining a laser oscillation wavelength. Preferably, the waveguide comprises a substrate having an electro-optic coefficient of no less than $r_{33}$=240 pm/V and a strain-optic coefficient in the range of about 0.1. Preferably, the waveguide is created in the substrate by inducing a compressive strain field within the substrate, wherein this compressive strain field creates a graduated variation in the index of refraction of the substrate. To this end, the strain-induced waveguide may be formed on a flat or structured substrate. The means for determining a laser oscillation wavelength comprise a distributed Bragg reflector (DBR) formed on the waveguide. Preferably, the external cavity waveguide also comprises means for selecting a cavity mode.

In a preferred embodiment of the invention, the apparatus comprises a wavelength selective element for regulating the output wavelength of a laser, wherein the apparatus comprises a strain-induced, graded index, buried waveguide formed in a substrate of $Sr_xBa_{(1-x)}Nb_2O_6$ (SBN) and having an electro-optically tunable distributed Bragg reflector (DBR) disposed in a portion of the waveguide. In this embodiment, a portion of the light emitted by the semiconductor laser is selected and fed back into the optically active (gain) region of the semiconductor laser as a function of a pre-determined external voltage difference which is selectively applied across a portion of the waveguide adjacent to the distributed Bragg reflector (DBR).

In a preferred embodiment of the invention, the novel external cavity waveguide comprises a substrate formed from $Sr_xBa_{(1-x)}Nb_2O_6$ (SBN), and further comprises electro-optically tunable phase control means and electro-optically tunable wavelength selection means. In this embodiment, a strain-induced, graded index, buried waveguide is adapted to shift between spatial modes of the laser as a function of a pre-determined external voltage difference which is selectively applied to a portion of the waveguide. Additionally, the electro-optically tunable wavelength selection means comprise an electro-optically tunable distributed Bragg reflector (DBR) which is disposed in a portion of the same waveguide. With this construction, a portion of the light emitted by the semiconductor laser is selected and fed back by the DBR into the optically active (gain) region of the semiconductor laser as a function of the same pre-determined external voltage difference that is applied to the waveguide in order to shift between spatial modes. In this way, the external cavity waveguide shifts between spatial modes in a synchronous manner as the DBR shifts between wavelengths.

In another preferred embodiment of the invention, the apparatus comprises a wavelength selective element for regulating the output wavelength of a laser, wherein the apparatus comprises a strain-induced, graded index, buried waveguide formed in a substrate of $Pb_{(1-x)}La_x(Ti_{(1-y)}Zr_y)_{(1-(x/4))}O_3$ (PLZT) and having an electro-optically tunable distributed Bragg reflector (DBR) disposed in a portion of the waveguide. In this embodiment, a portion of the light emitted by the semiconductor laser is selected and fed back into the optically active (gain) region of the semiconductor laser as a function of a pre-determined external voltage difference which is selectively applied across a portion of the waveguide adjacent to the distributed Bragg reflector (DBR).

In another embodiment of the invention, the novel external cavity waveguide comprises a substrate formed from $Pb_{(1-x)}La_x(Ti_{(1-y)}Zr_y)_{(1-(x/4))}O_3$ (PLZT), and further comprises electro-optically tunable phase control means and electro-optically tunable wavelength selection means. In this embodiment, a strain-induced, graded index, buried waveguide is adapted to shift between spatial modes of the laser as a function of a predetermined external voltage difference which is selectively applied to a portion of the waveguide. Additionally, the electro-optically tunable wavelength selection means comprise an electro-optically tunable distributed Bragg reflector (DBR) which is disposed in a portion of the same waveguide. With this construction, a portion of the light emitted by the semiconductor laser is selected and fed back by the DBR into the optically active (gain) region of the semiconductor laser as a function of the same pre-determined external voltage difference that is applied to the waveguide in order to shift between spatial modes. In this way, the external cavity waveguide shifts between spatial modes in a synchronous manner as the DBR shifts between wavelengths.

In another form of the present invention, the aforementioned strain-induced waveguide may be replaced by an epitaxially deposited film of ferroelectric electro-optical material deposited on the ferroelectric electro-optical substrate, wherein the film has a different index of refraction than the substrate.

And in another form of the present invention, a novel external cavity waveguide is provided which comprises a substrate having an electro-optic coefficient of no less than $r_{33}=240$ pm/V and a strain-optic coefficient which is positive.

BRIEF DESCRIPTION OF THE DRAWINGS

These and other objects, features and advantages of the present invention will be more fully disclosed in, or rendered obvious by, the following detailed description of the preferred embodiments of the invention, which is to be considered together with the accompanying drawings wherein like numbers refer to like parts and further wherein.

DETAILED DESCRIPTION OF THE PREFERRED EMBODIMENTS

This patent application claims benefit of pending prior U.S. Provisional patent application Ser. No. 60/004,620, filed Sep. 29. 1995 by Parviz Tayebati for AGILE, WIDELY TUNABLE DIODE LASER WITH NARROW LINEWIDTH, which document is hereby incorporated herein by reference; and pending prior U.S. Provisional patent application Ser. No. 60/004,940, filed Oct. 4, 1995 by Parviz Tayebati for WIDELY TUNABLE, MINIATURE SINGLE MODE DIODE LASER ARRAYS WITH NARROW LINEWIDTH, which document is also hereby incorporated herein by reference.

The present invention is contemplated for use with a commercially available diode laser of the sort well known in the art. More particularly, and referring now to FIG. 1, diode laser 5 typically comprises an active section 10 (i.e., the gain medium) at the junction between two semiconductor materials, such as GaAs or $Al_xGa_{(1-x)}$ or InGaAsP or the like. Under appropriately chosen electrical conditions, this arrangement will create a light beam by stimulated emission. Commercially available diode lasers of the sort envisioned for use with the present invention typically emit light over a range of wavelengths of approximately 650–2000 nm.

Typically, diode laser 5 comprises a first mirrored end 20 and a second mirrored end 30. Active section 10 is disposed substantially between first mirrored end 20 and second mirrored end 30, and guides the light beam back and forth between them. First mirrored end 20 is typically partially reflective so as to allow a beam of laser light to be emitted therefrom. First mirrored end 20 is usually rendered partially reflecting by cleaving or etching methods of the sort well known in the art. Second mirrored end 30 of diode laser 5 is typically a fully reflective mirror. When used in connection with the present invention, however, second mirrored end 30 is rendered substantially transmissive to the output of diode laser 5 through the use of an anti-reflection (AR) coating. In particular, second mirrored end 30 may first be stripped to expose its facet, and a 3-element AR coating may then be used to produce low reflectivities, e.g., reflectivities in the range of about $10^{-1}$–$10^{-5}$.

Figure 1:
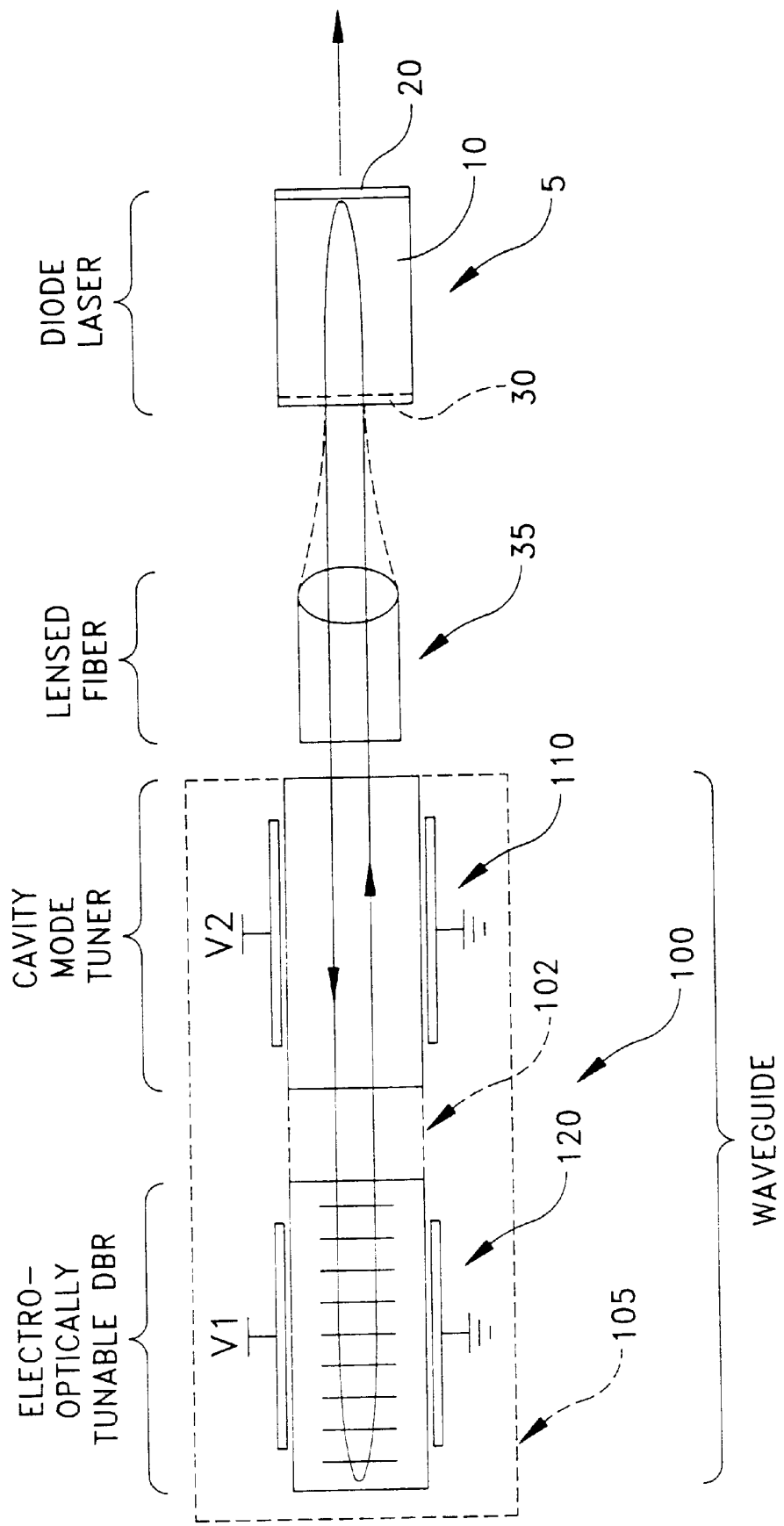
FIG. 1 is a schematic top view of a novel hybrid semiconductor laser comprising an external cavity tuning element formed in accordance with the present invention.
Figure 2:
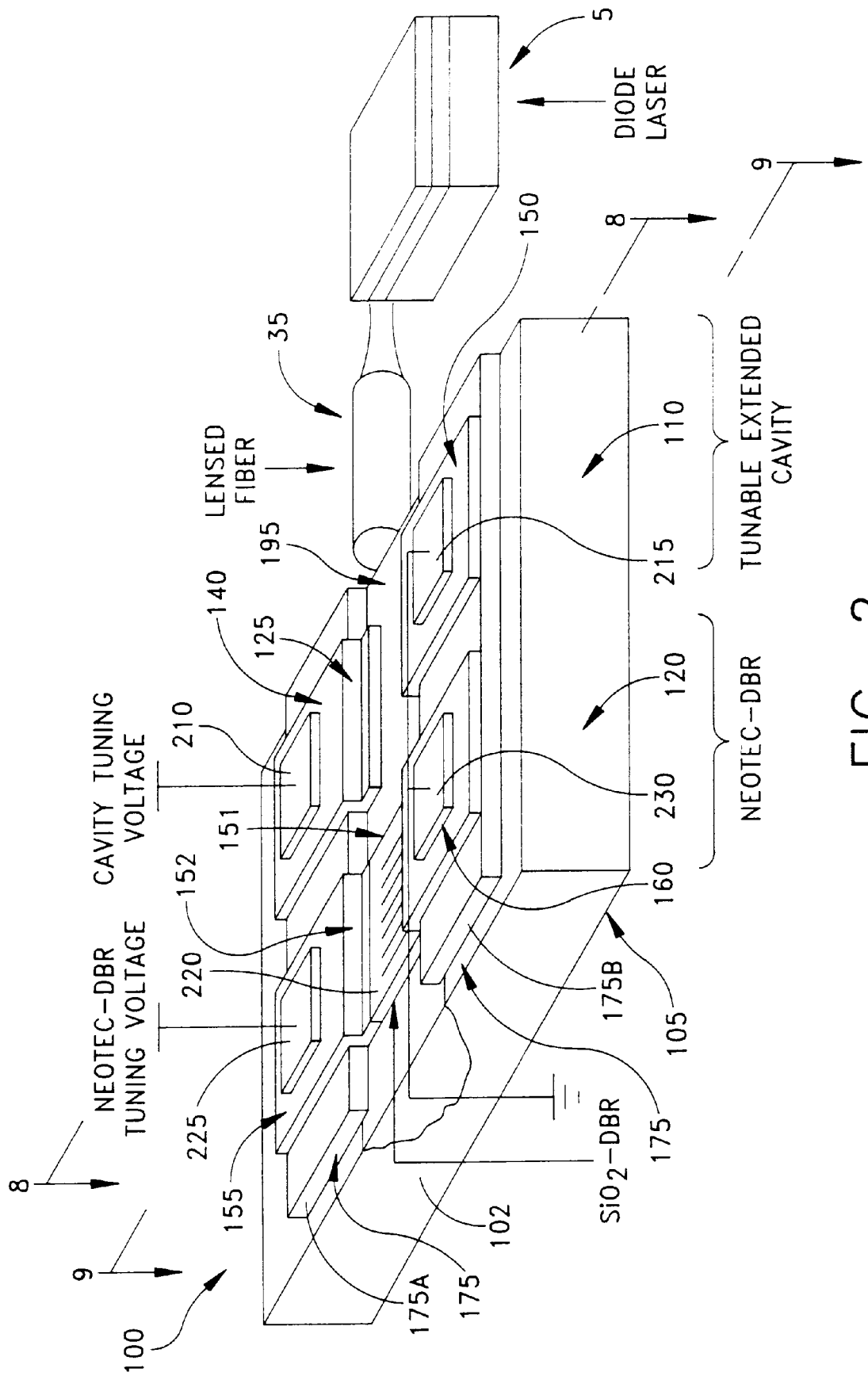
FIG. 2 is a perspective view, partially in section, of the novel hybrid semiconductor laser shown in FIG. 1.
Figure 3:
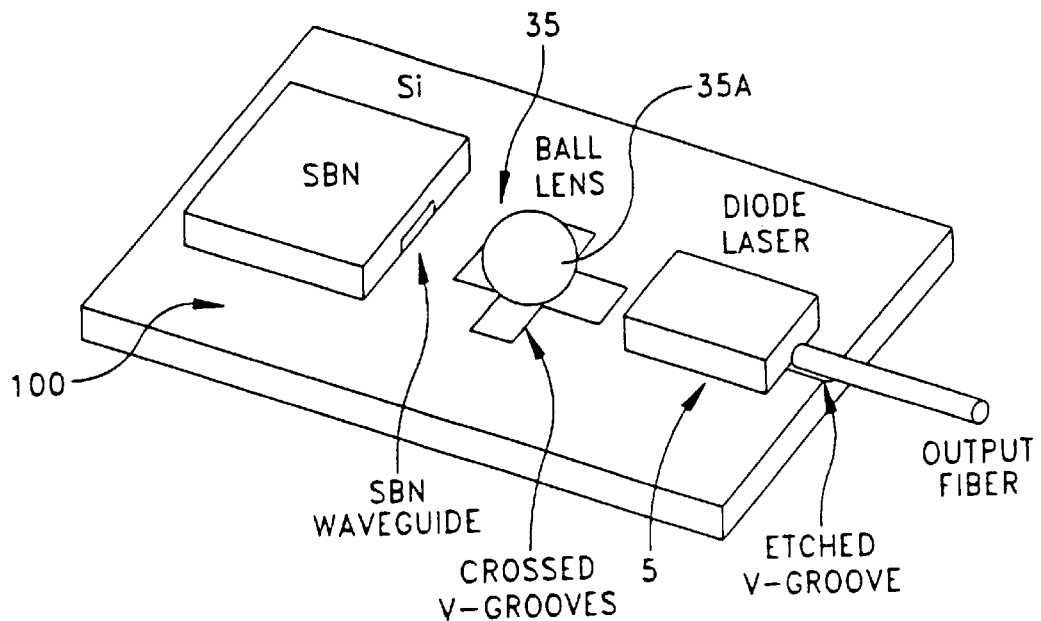
FIG. 3 is a perspective view of one embodiment of a novel hybrid semiconductor laser formed in accordance with the present invention and packaged with silicon waferboard technology.
Figure 4:
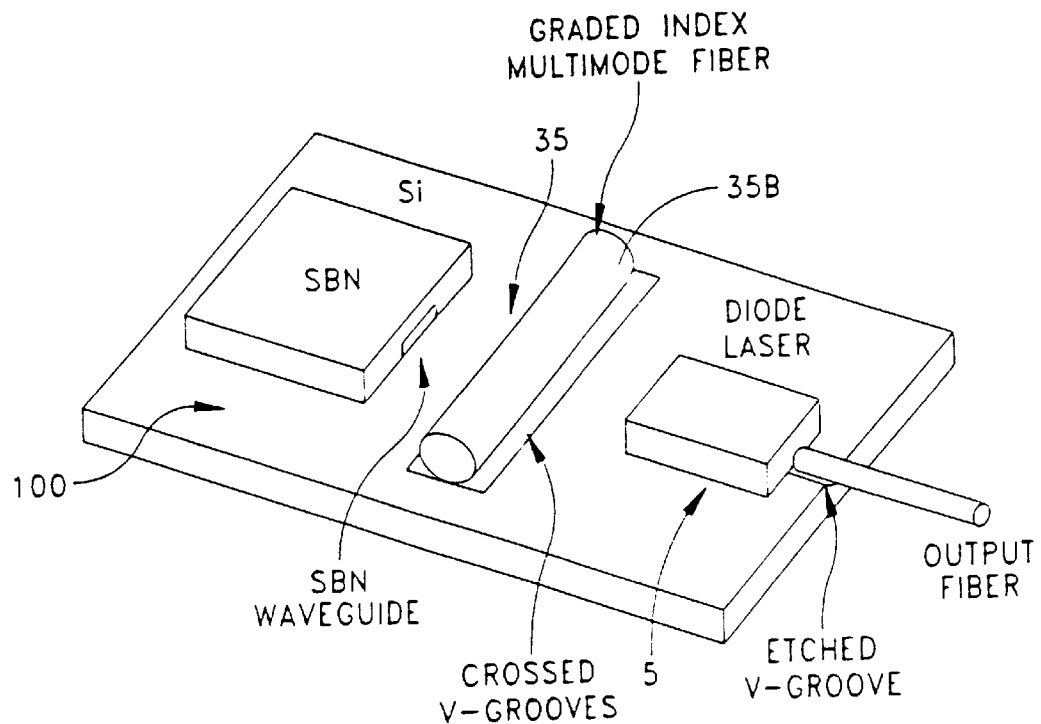
FIG. 4 is a perspective view of another embodiment of a novel hybrid semiconductor laser formed in accordance with the present invention and packaged with silicon waferboard technology.

In one preferred embodiment of the present invention, best illustrated in FIGS. 1 and 2, an external cavity 100 is cooperatively positioned relative to active section 10, i.e., at second end 30 of diode laser 5. This arrangement may be facilitated by lens means or by a length of appropriately lensed optical fiber, as shown generally at 35 in FIGS. 1 and 2. By way of example but not limitation, silicon waferboard technology may be utilized to couple diode laser 5 to external cavity 100 by means of a spherical ball lens 35A (FIG. 3) or a length of optical fiber 35B (FIG. 4). In one particular embodiment of the present invention, a multi-mode, graded index fiber 35B is used as a cylindrical lens by placing the fiber transverse to the beam of laser light emitted by diode laser 5, as shown in FIG. 4. It will be appreciated that, with such a construction, the imaging properties of the fiber will be enhanced where the index of refraction is graded in the radial direction, whereby efficient coupling between the laser and the waveguide may be achieved.

Figure 5:
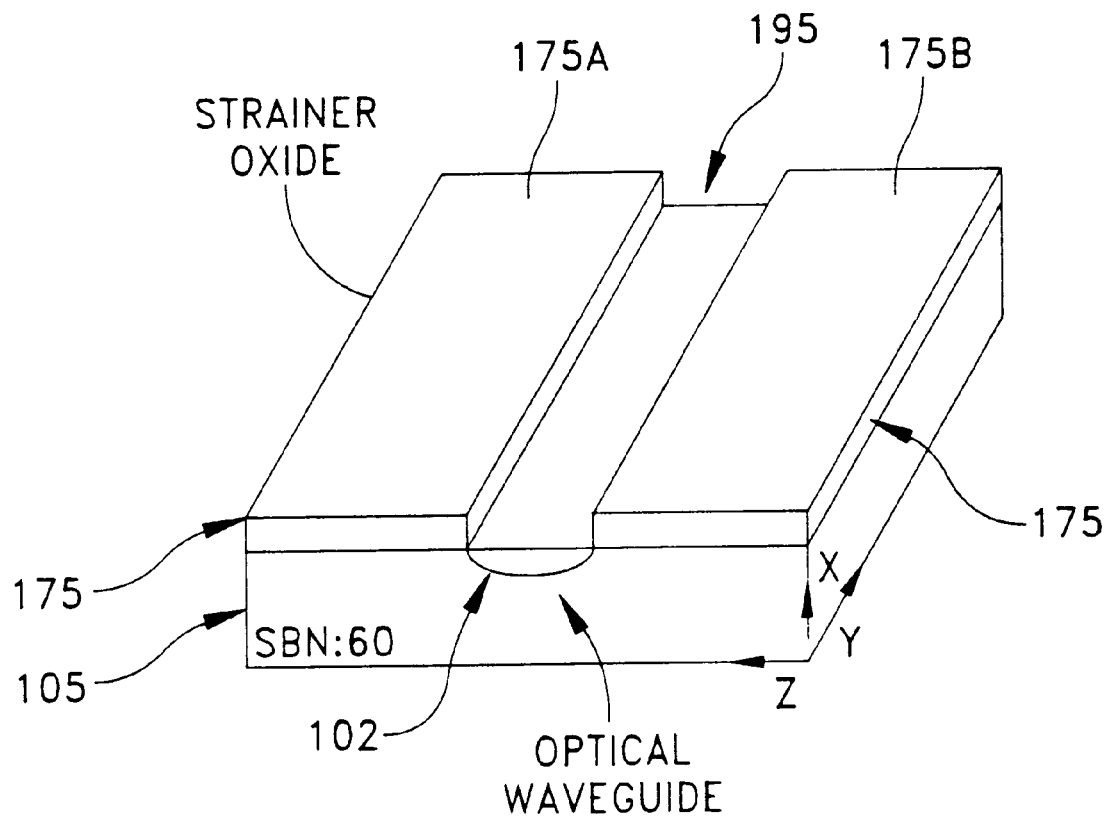
FIG. 5 is a schematic perspective view of the waveguide shown in FIG. 2.

Referring now to FIGS. 1, 2 and 5, external cavity 100 preferably comprises a strain-induced, graded index, buried waveguide 102 formed in a substrate of material 105, where substrate 105 is formed out of a ferroelectric electro-optical material. Preferably this ferroelectric electro-optic material possesses a very large electro-optic coefficient, e.g., no less than about $r_{33}$=240 pm/V. In a preferred embodiment of the invention, external cavity 100 may comprise a total size that is less than 10 mm$^3$.

Preferably, external cavity 100 also includes phase control means 110 (FIGS. 1 and 2) and wavelength-selection means 120 associated with waveguide 102.

More particularly, phase control means 110 are preferably formed in a first section of external cavity 100, indicated generally at 125 (FIG. 2). Phase control means 110 are adapted to allow shifting of the longitudinal modes of the laser cavity (formed between first mirrored end 20 and wavelength selection means 120) at the same rate as the wavelength shifting performed by the wavelength selection means 120. This feature allows tuning of the laser mode without mode hopping, as will hereinafter be discussed in further detail. Phase control means 110 are operated by applying a voltage difference across electrodes 140 and 150, as will hereinafter be discussed in further detail.

Wavelength-selection means 120 comprise an electro-optically tunable distributed Bragg reflector (DBR) 151. DBR 151 of wavelength-selection means 120 is fabricated on a second section of external cavity 100, indicated generally at 152, and comprises a uniform grating period as is required for a narrow laser/filter linewidth. Wavelength-selection means 120 are adapted to dynamically shift between the wavelengths of light output by diode laser 5, by application of a voltage difference across electrodes 155 and 160, as will hereinafter be discussed in further detail.

It is to be appreciated that the shifting between cavity modes and wavelengths may be synchronized by the simultaneous application of the same voltage difference across both phase control means 110 and wavelength-selection means 120, as will hereinafter be discussed in further detail.

Figure 6:
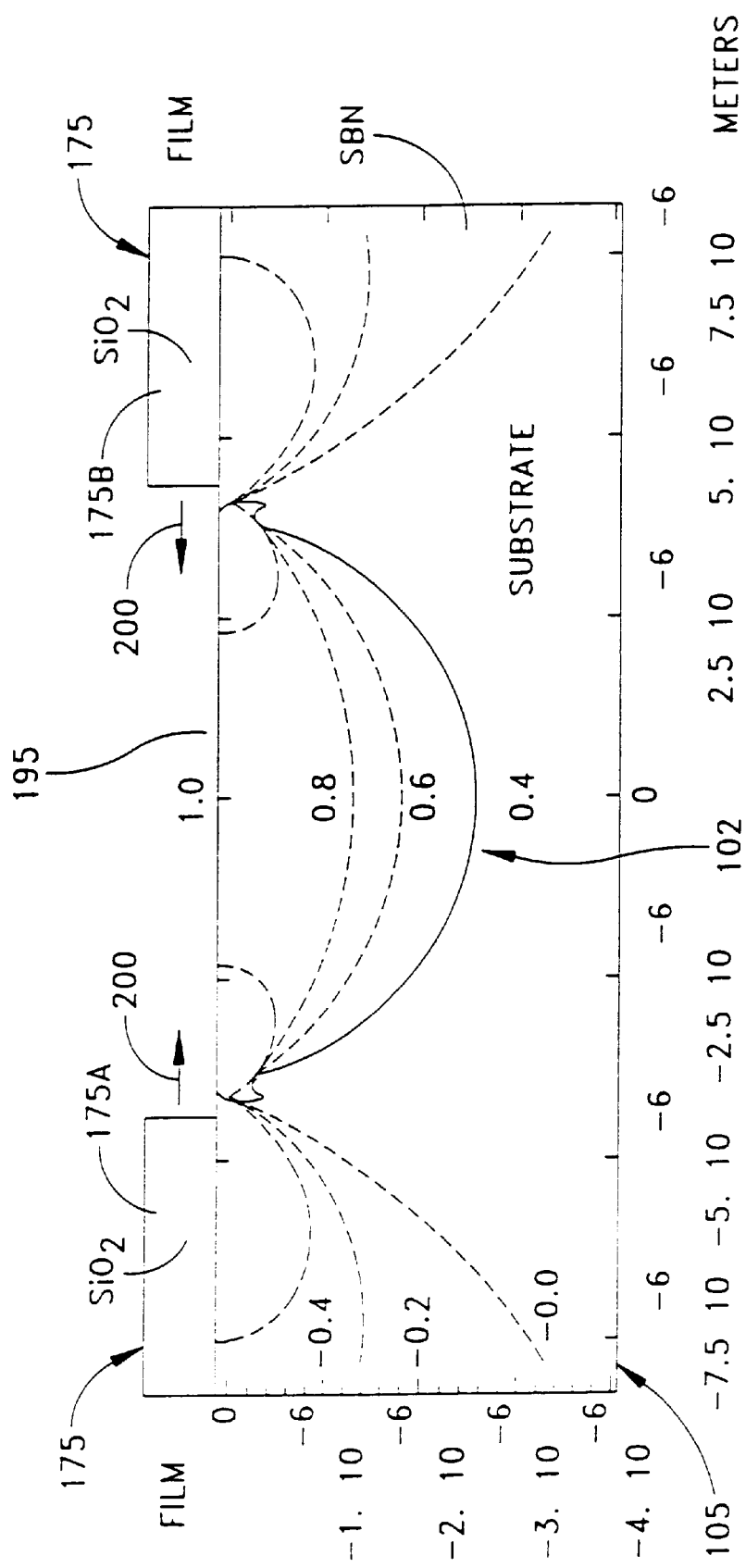
FIG. 6 is a schematic cross-sectional view of a waveguide formed in accordance with the present invention, showing the strain contour lines within the substrate and indicating the direction of relaxation of the unetched $SiO_2$ layers.

In the preferred embodiment of the present invention, external cavity 100 comprises the optical waveguide 102 (FIGS. 1, 2 and 5) which is formed by selectively inducing a compressive mechanical strain field within the highly electro-optic substrate 105, thereby creating a graduated set of constant strain contours through the substrate crystal, as shown in FIG. 6. These strain contours, in turn, cause a graduated variation in the index of refraction through the region of the substrate which is subjected to the strain field by virtue of the well known strain-optic effect. Various ferroelectric electro-optic materials may be used to fabricate substrate 105, with highly electro-optic materials being preferred. By way of example, substrate 105 may be formed out of $Sr_xBa_{(1-x)}Nb_2O_6$ (SBN), $Pb_{(1-x)}La_x(Ti_{(1-y)}Zr_y))_{(1-x/4))}O_3$ (PLZT), $LiNbO_3$, $LiTaO_3$, $BaTiO_3$ or other such highly electro-optic materials. In general, substrate 105 preferably should have an electro-optic coefficient of no less than $r_{33}$=240 pm/V and a strain optic coefficient which is positive. Preferably substrate 105 is formed out of a material having a strain-optic coefficient in the range of about 0.1. SBN (using the linear electro-optic effect) and PLZT (using the quadratic electro-optic effect) are preferred materials for forming substrate 105 and, in this context, SBN:61 and SBN:75 are particularly preferred.

As noted above, optical waveguide 102 is preferably formed in the highly electro-optic substrate 105 by selectively inducing a compressive mechanical strain field within the substrate. In a preferred embodiment of the invention, this is accomplished by depositing a strainer film 175 of $SiO_2$ (FIGS. 2, 5 and 6) onto the substrate's surface, followed by the selective removal of a portion of the film.

More particularly, a layer 175 of $SiO_2$ (FIGS. 2, 5 and 6) is first deposited onto substrate 105 at an elevated temperature. Preferably, the $SiO_2$ film 175 is deposited on substrate 105 by using RF sputtering (or other thin film deposition methods) onto a substrate heated to a temperature of between approximately 200–300 degrees Celsius, under approximately 200 millitorr of oxygen pressure. $SiO_2$ thicknesses in the range of from about 1–3 microns have been found to yield the best results. The substrate is then cooled to approximately room temperature, i.e., to around 20 degrees Celsius. Under these conditions, the top layer 175 of $SiO_2$ creates a compression-induced strain field within a portion of the substrate which is disposed below the $SiO_2$. This compression-induced strain field is formed due to the significantly different coefficients of thermal expansion of the two materials, i.e., the coefficient of thermal expansion of $SiO_2$ is about $0.55 \times 10^{-6}$ K$^{-1}$, as compared to about $6.5 \times 10^{-6}$ K$^{-1}$ for $Sr_xBa_{(1-x)}Nb_2O_6$ (SBN) and about $5 \times 10^{-6}$ K$^{-1}$ for $Pb_{(1-x)}La_x(Ti_{1-y}Zr_y)_{(1-(x/4))}O_3$ (PLZT).

In order to form the desired constant strain contours within substrate 105, and thereby the desired graded variation in the substrate's index of refraction, a channel 195 (FIGS. 2, 5 and 6) is formed in the $SiO_2$ layer 175 by selectively etching away a relatively narrow portion of the $SiO_2$ layer. Channel 195 effectively divides $SiO_2$ layer 175 into two strips or segments, 175A and 175B. Channel 195 may be precisely etched by using photomask methods of the sort well known in the art. More particularly, known photomask methods have been used to produce waveguides in accordance with the present invention, including waveguide channel widths of 6, 8, 10, 12 and 15 microns. Channel 195 is preferably formed with a linewidth-to-line space ratio of about 1:7. In one embodiment, using a TE mode 1.3 micron laser, clear guiding was achieved in an 8 micron wide waveguide. Etching is preferably done using HF acid, even though HF etches $SiO_2$ isotropically. It has been found that an $SiO_2$ layer of less than 1 micron can create sufficient strain for waveguide applications, and preferably an $SiO_2$ layer of about 1–3 microns is used when forming stress-induced waveguides in accordance with the present invention (see FIGS. 2, 5, and 6).

Figure 7:
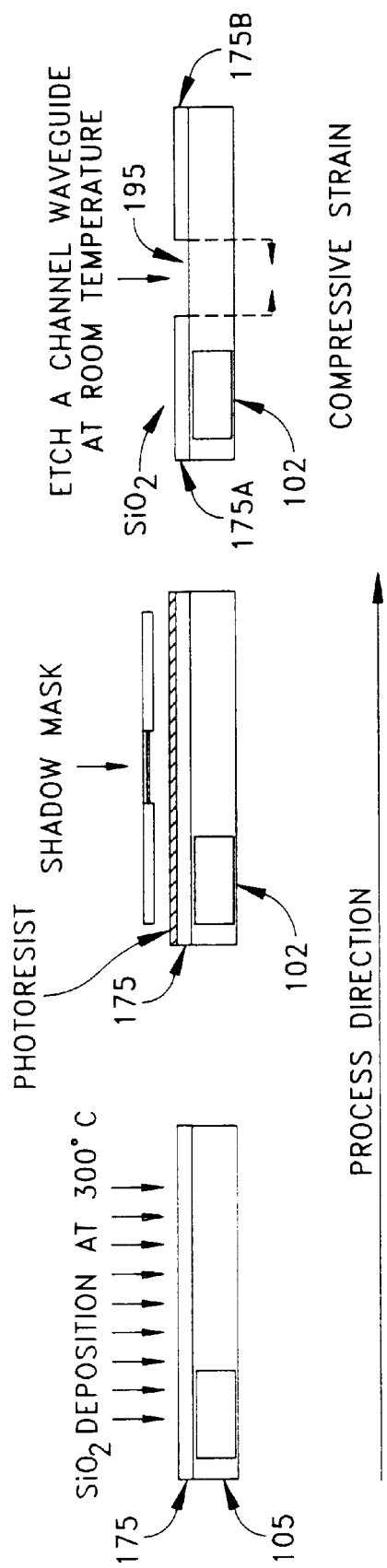
FIG. 7 is a block diagram showing the process steps for forming a strain-induced, graded index, buried waveguide in accordance with the present invention.

FIG. 7 shows, in simple schematic form, some of the important steps in the aforementioned stress-induced waveguide fabrication process.

Once channel 195 is created, the remaining $SiO_2$ portions (i.e. the strips 175A and 175B disposed on either side of channel 195) expand near the edges adjacent to channel 195, in the manner generally indicated by the arrows 200 in FIG. 6. This tends to concentrate the strain along the lower edges of the $SiO_2$ strips 175A and 175B. This variation in the strain field, in turn, causes the refractive index profile within substrate 105 to change as well, by virtue of the well known strain-optic effect (see FIG. 6). The resulting strain-optic-induced index of refraction profile, as a function of the strain component S3, is generally given by the equation: $\Delta n_i = -(n_i^3/2)P_iS_3$, with i=1,3 corresponding to the TE and TM polarizations, respectively, $P_{13}$ and $P_{33}$ corresponding to the magnitudes of the relevant strain-optic coefficients, and $n_1$=2.239, $n_3$=2.216 corresponding to the refractive index values at a wavelength of 1.3 microns. Preferably both $P_{13}$ and $P_{33}$ are positive. As a consequence of the foregoing, the introduction of compressional strain in substrate 105 ($S_3$<0) will produce an increase in the substrate's refractive index, as required for waveguiding light waves of both TE and TM polarizations. In this way the optical waveguide 102 (FIGS. 2, 5 and 6) is created in substrate 105. It will be appreciated that, in addition to the strain-optic effect, the net refractive index change will also include an electro-optic contribution due to (i) the electric field produced in the strain region by the piezoelectric effect, and (ii) the electric field produced by any surface charge distributions.

In the present invention, it has been found that the compressive strain created at the surface of substrate 105 (i.e., after etching of the $SiO_2$ layer 175 has been completed) increases as a function of the distance from the center of the channel. A maximum value for the compressive strain is reached adjacent to the edges of the $SiO_2$ strips 175A and 175B (see FIG. 6). It will be appreciated that, when forming a strain-induced, graded-index, buried waveguide in accordance with the present invention, care should be taken to avoid the creation of two or more separate waveguides for one channel, due to the overlapping of strain fields. For best results, calculations using the above-indicated relationship should be based on $P_{13}$=0.1 and $P_{33}$=0.47, so as to yield $\Delta n = 10^{-4}$.

As a result of the aforementioned construction, the index of refraction profile of external cavity 100 will follow the strain field contours within substrate 105. In this way, the buried waveguide (see FIG. 6) is created within the substrate which comprises a slowly varying refractive index profile so as to provide for a low loss waveguide. In particular, it has been found that the strain induced by the deposition/etching of the $SiO_2$ layer 175 creates a waveguide having losses of only about 1.4–2 dB/cm at a wavelength of 1.3 microns.

In order to achieve proper optical coupling into and out of external cavity 100, the ends of the external cavity have to be polished to a high optical quality. This is done using standard techniques of the sort well known in the art.

Figure 8:
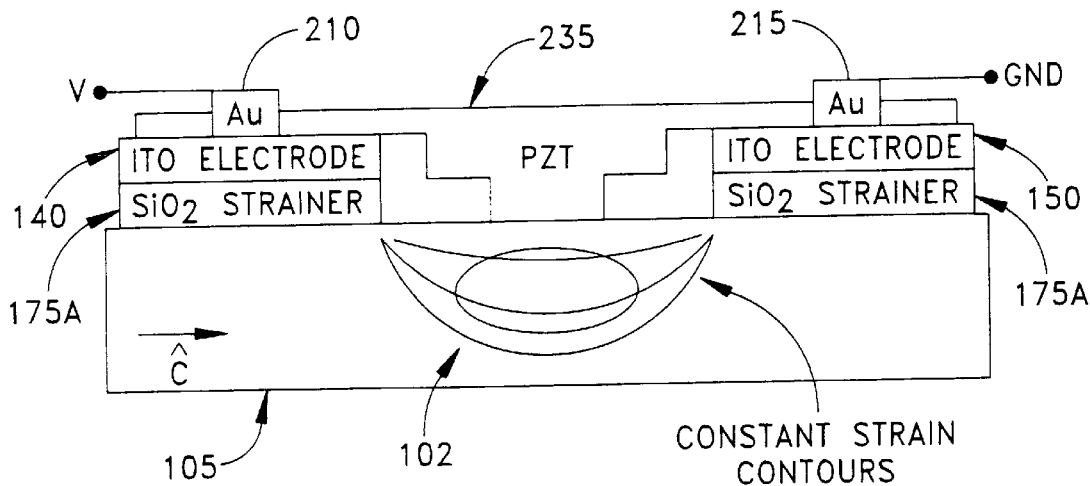
FIG. 8 is a schematic cross-sectional view taken through line 8—8 of FIG. 2.

Referring next to FIGS. 1, 2 and 8, phase control means 110 are formed in first section 125 of external cavity 100 by forming electrodes 140 and 150 on the $SiO_2$ strips 175A and 175B, on either side of channel 195. More particularly, electrodes 140 and 150 may comprise a layer of $InSnO_2$ (also known as ITO), or a layer of Ni or Pt, that is deposited onto the $SiO_2$ strips 175A and 175B, adjacent to first section 125 of external cavity 100. The electrode material may be deposited on the $SiO_2$ strips by conventional deposition methods of the sort well known in the art, e.g., by conventional vapor deposition. Low resistivity gold contact pads 210 and 215 are then deposited onto the electrodes 140 and 150, respectively, so as to allow for subsequent bonding to external conductors (not shown).

Electrodes 140 and 150 are positioned on the top of $SiO_2$ strips 175A and 175B adjacent to the etched channel 195 and in opposing, spaced relation to one other. Electrodes 140 and 150 are positioned on first section 125 of external cavity 100 so that a pre-determined voltage difference may be applied across the two electrodes, and hence across the etched channel 195. Due to the very large electro-optic coefficient of substrate 105, this voltage difference causes a very fast, pre-determined change in the index of refraction profile in the portion of substrate 105 which is disposed below first section 125, and between electrodes 140 and 150. This electrically-induced change in the index of refraction profile within external cavity 100 occurs as a result of the highly electro-optic properties of the substrate. It should be understood, however, that this electrically-induced change is localized, in the sense that it effectively occurs only between electrodes 140 and 150. Thus, by selectively changing the voltage difference across electrodes 140 and 150, the optical properties of external cavity 100 may be selectively and dynamically modified so as to shift between cavity modes, as will hereinafter be discussed in further detail. In particular, rates of change as fast as 1 nm/ns (nanometer/nanosecond) may be achieved with the present invention.

It will be appreciated that, inasmuch as the $SiO_2$ deposition temperature is typically higher than the Curie temperature of the substrate material, e.g., 78° C. for SBN:61, repoling of the substrate is required to restore single domain behavior and to recover the electro-optic properties of the substrate. To this end, it has been found that the best results are achieved by applying the poling voltage along the c-axis of the substrate crystal. In waveguides formed in accordance with the present invention, the poling voltage is preferably applied in the same direction as the tuning voltage, i.e., substantially perpendicular to channel 195 in external cavity 100. Repoling electric fields in the range of about 6–8 kV/cm have been used with good results. Typically, electrodes 140 and 150 may be used for both repoling and for electro-optical mode selection.

Figure 9:
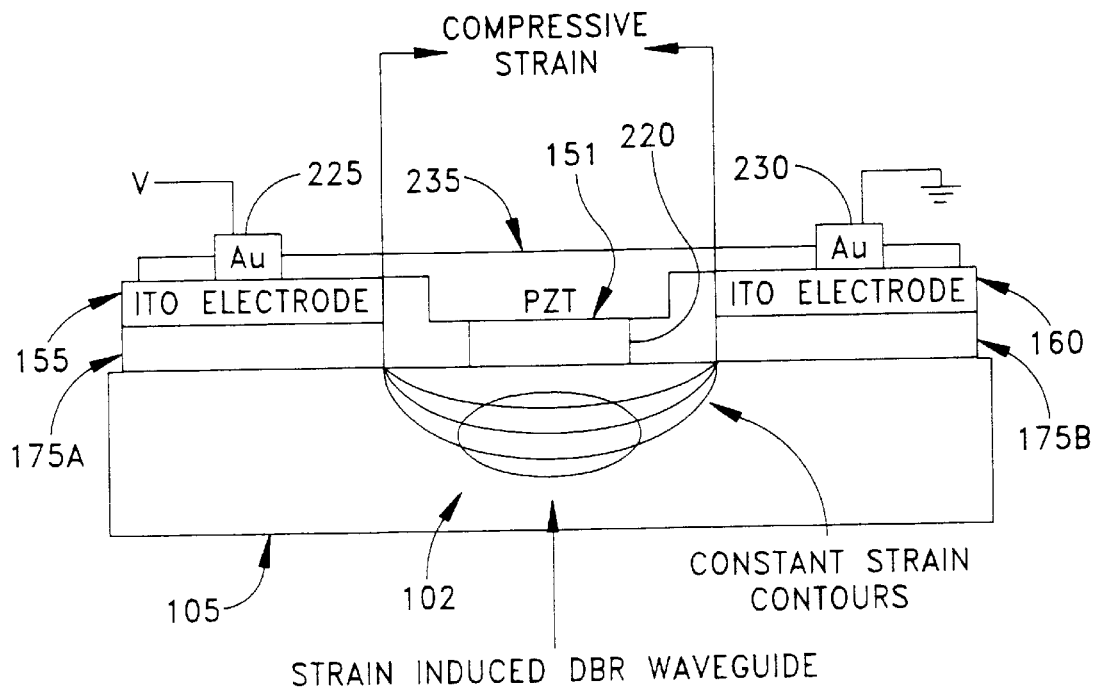
FIG. 9 is a schematic cross-sectional view taken through line 9—9 of FIG. 2.

Referring next to FIGS. 1, 2 and 9, wavelength-selection means 120 comprise a distributed Bragg reflector (DBR) 151 that is formed within channel 195.

In one technique, a secondary layer 220 of $SiO_2$ is first deposited into channel 195 at the second section 152 of external cavity 100. Then a series of corrugations forming a grating of about 0.5 micron spacing are fabricated on a film of photoresist that has been deposited onto secondary layer 220. This film of photoresist is preferably less than 0.3 micron thick. The photoresist is then developed and removed so as to yield the desired corrugations. Preferably, a photopolymer (e.g., Shipely holographic photoresist) is spin coated over the waveguide. Then, using a standard holographic technique, an Argon laser (having a 454–484 nm line) is used to record and develop a grating in the photopolymer, with the grating wavevector being oriented parallel to the waveguide, i.e., parallel to the longitudinal axis of channel 195. It will be appreciated that, in order to obtain the desired DBR tuning effect, the DBR grating spacing mismatch $((\Lambda_1 - \lambda/2n_{eff})/\Lambda)$ must fall within the spectral range of diode laser 5. For first order DBR center wavelengths in the range of about 0.6–2 microns, the grating periods must be in the range of from about 0.1–0.3 microns.

Alternatively, DBR 151 can be formed by first depositing a secondary layer 220 of $SiO_2$ into channel 195 at the second section 152 of external cavity 100. Secondary layer 220 is typically about 5 microns wide. A shallow DBR grating is then fabricated onto secondary layer 220 by holographic and etching methods of the sort well known in the art.

Advantageously, in the DBR 151 fabricated in accordance with the foregoing techniques, the grating is disposed in the "cladding" of the waveguide. Consequently, since about 20% of the guided-energy is evanescent, the waveguide is influenced by the recorded grating sufficiently to cause the guided wave to be redirected back into the laser's optically active region.

In another possible procedure, the DBR grating formed on the photopolymer is transferred onto the surface of the waveguide by ion milling or a reactive ion etching (RIE) technique. This method may be improved by first transferring the grating onto a metal grating (e.g., aluminum) which is more suitable for ion beam milling or RIE.

Figure 10:
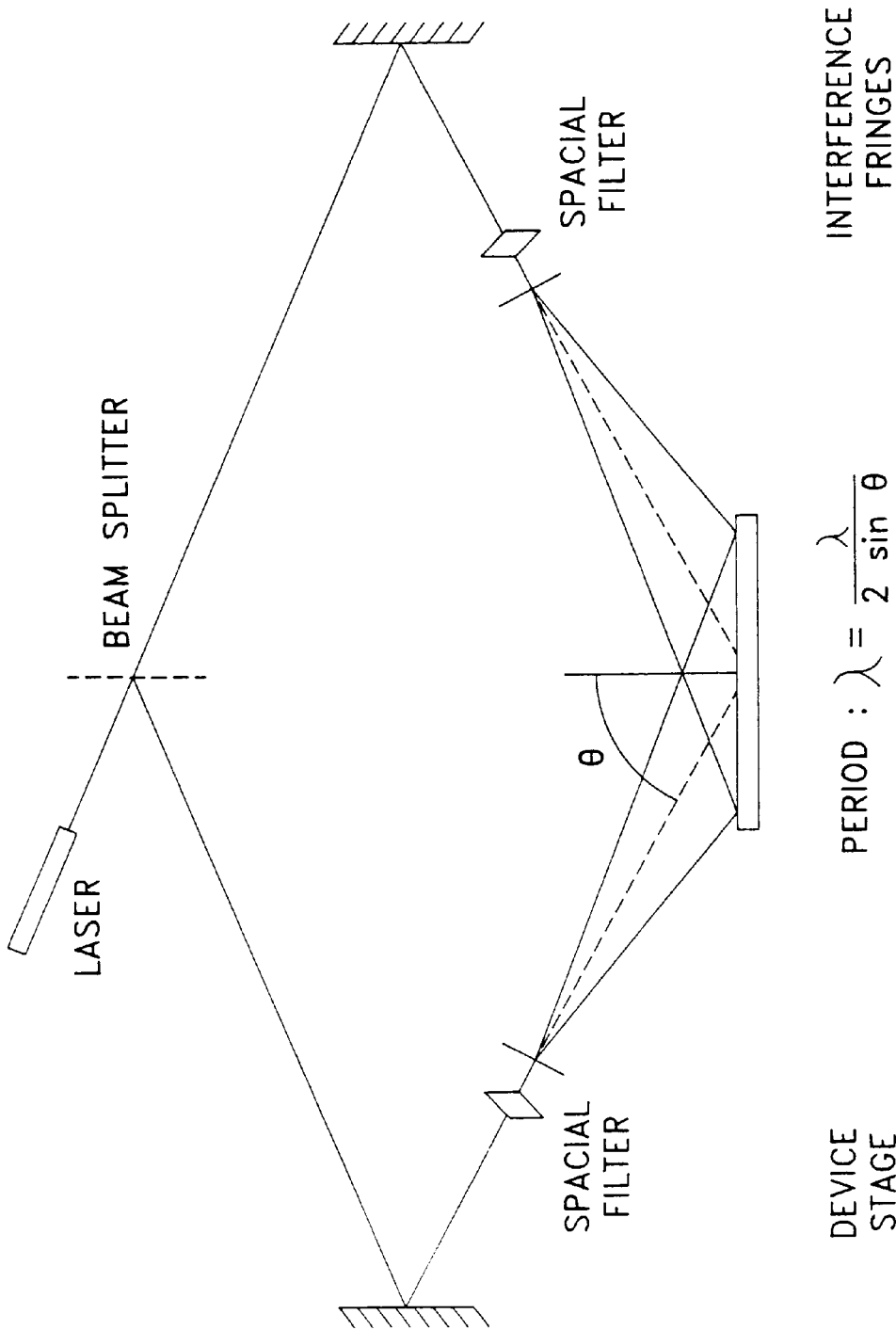
FIG. 10 is a schematic representation of a holographic method of recording a DBR grating in a photoresist overcoating layer according to one embodiment of the present invention.

Alternatively, the photorefractive effect may be used to form the DBR in the waveguide. More particularly, when a photorefractive crystal such as substrate 105 is illuminated by two interfering laser beams, e.g., in the manner shown in FIG. 10, its refractive index changes periodically between the dark and illuminated regions. This interference pattern is recorded in substrate 105 in the form of index modulation, and thereby forms a grating. It will be appreciated that the index modulation depends upon exposure time, ferroelectric crystal properties, etc. This method presents a non-invasive approach for fabricating a DBR within the core of the waveguide.

Electrodes 155 and 160 are formed on $SiO_2$ strips 175A and 175B, adjacent to second section 152 and in the same manner as electrodes 140 and 150 are formed. More particularly, electrodes 155 and 160 may comprise a layer of $InSnO_2$ (ITO), or a layer of Ni or Pt, that is vapor deposited onto the $SiO_2$ strips 175A and 175B adjacent to second section 152 of external cavity 100. Low resistivity gold contact pads 225 and 230 are then deposited onto the electrodes so as to allow for subsequent bonding to external conductors (not shown). Electrodes 155 and 160 are also positioned on the $SiO_2$ strips 175A and 175B, adjacent to second section 152, in opposing, spaced relation to one another. Like electrodes 140 and 150, electrodes 155 and 160 are positioned on second section 152 so as to apply a pre-determined voltage difference across the DBR. By applying a pre-determined voltage difference across the DBR, a pre-determined variation in the index of refraction profile in the waveguide which is disposed below the DBR is induced electro-optically. Thus, by selectively changing the voltage difference across electrodes 155 and 160, the DBR 151 can be caused to dynamically select different wavelengths of light output by diode laser 5.

Preferably, exactly the same external voltage difference is established across electrodes 140 and 150, and electrodes 155 and 160, so that the external cavity waveguide will shift between spacial modes in a synchronous manner as the DBR shifts between wavelengths.

More particularly, the DBR portion of external cavity 100 acts as a sharp band stop optical filter that retro-reflects a pre-determined portion of the output spectrum of diode laser 5. The retro-reflected wavelength typically corresponds to the DBR's center wavelength, i.e., the wavelength whose wavevector is an integer multiple of the DBR grating wavevector. In the present invention, when an electric field is applied across electrodes 155 and 160, the center wavelength shifts. The magnitude of this shift is given by the formula: $|\Delta\lambda/\lambda|=|\Delta n/n|=|n^2 rE/2|$. For example, voltages in the range of ±70 volts, applied across a 5 micron wide waveguide strip in the DBR, yields a $\Delta n_{eff}$ of about ±0.16. Operating at 850 nm, the tuning range may be about ±60 nm. Operating at 1550 nm, tunability will be approximately ±105 nm. Voltages in the range of ±100 volts, applied across a 7 micron wide DBR waveguide, have yielded up to 2.5 nm of tuning. In one preferred embodiment, by utilizing a tapered waveguide with electrode spacing of approximately 3 microns, the tuning range may be increased to about ±105 nm at 850 nm, and about ±175 nm at 1550 nm.

Phase control means 110 and wavelength-selection means 120 together comprise a monolithic structure capable of having the same voltage difference simultaneously applied across the electrode pair 140, 150 and the electrode pair 155 and 160, so as to shift both the cavity mode and the DBR-selected wavelength synchronously with respect to one another, without inducing unwanted mode hopping.

Figure 11:
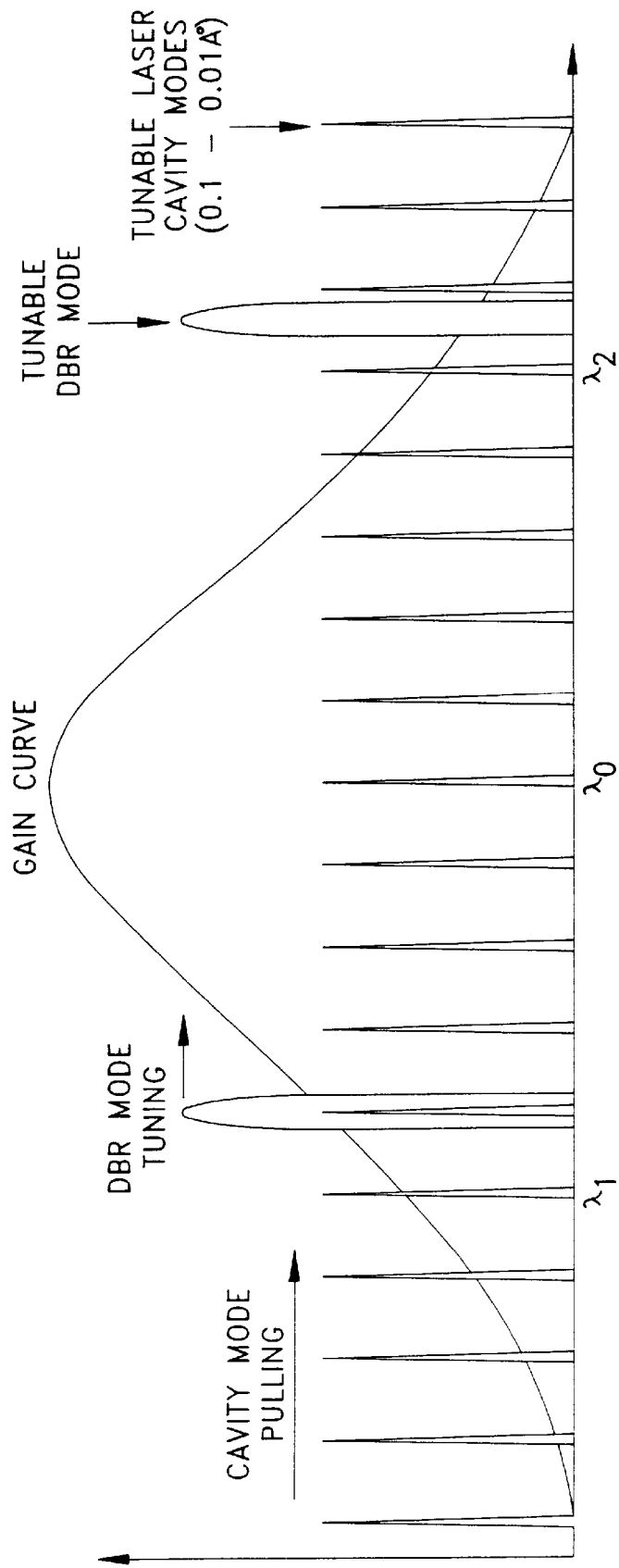
FIG. 11 is a graphical representation of the cavity modes for the hybrid semiconductor laser shown in FIGS. 1 and 2 superimposed on the gain curve for that same laser.

More particularly, and referring now to FIG. 11, an external cavity laser resonance condition typically also includes a phase condition. Specifically, the round trip phase of the laser light as it travels through the external cavity and returns to the optically active region of the laser must be equal to an integer multiple of $2\pi$. This relationship may be expressed as follows: $2n_{eff}(2\pi/\lambda)L=m2\pi$, where m=1, 2, 3 . . . In this equation, $n_{eff}$ is the effective index of refraction as determined by the cavity waveguide mode structure and L is the cavity length. It will be appreciated that each solution of this phase equation is a possible mode of the laser system. Consequently, when the wavelength of the laser is changed by changing the voltage difference applied across second section 152 of external cavity 100 (i.e., the DBR 151), the points at which the phase condition for the cavity (i.e., m2π) are satisfied also changes. In prior art external tuning elements, this has lead to large mode jumps (or "mode hopping") in the laser.

Referring again to FIGS. 1 and 2, phase control means 110 are fabricated so as to be disposed in the optical path between diode laser 5 and wavelength-selection means 120. In this way, phase control means 110 act as a phase control element. More particularly, phase control means 110 permit single mode operation by electro-optic tuning of the cavity phase so that the cavity mode is "pulled" along with the DBR mode, as the DBR 151 is being tuned. Specifically, by application of the same voltage difference across electrodes 140, 150 and 155, 160, the effective index ($n_{eff}$) can be modified in phase control means 110 simultaneously with a shift in the reflected wavelength selected by the DBR 151, without mode hopping. This allows the phase condition of the laser cavity to be synchronously matched to the selected wavelength.

If desired, a PZT cap 235 (FIGS. 8 and 9) may be deposited in channel 195 to improve the efficiency of waveguide 102.

EXAMPLE 1

By way of example, a hybrid semiconductor laser may be formed according to this invention by first providing a substrate of $Sr_xBa_{(1-x)}Nb_2O_6$ (SBN) that is approximately 10 $mm^3$ in size. Preferably substrate 105 comprises SBN:61. The substrate is then heated in a conventional oven to a temperature of about 300 degrees Celsius. A film of $SiO_2$ is deposited onto the heated substrate of SBN by RF sputtering, under about 200 millitorr of oxygen pressure. The $SiO_2$ is deposited to an average thickness of approximately 1–2 microns along the top surface of the substrate. The substrate is then cooled to ambient temperature, e.g., about 20 degrees Celsius or so.

In order to form the desired constant strain contours within the substrate material, a channel is then selectively etched away from a portion of the $SiO_2$ layer. More particularly, a photoresist is applied to the surface of the $SiO_2$ and then patterned so as to leave a channel width of approximately 8 microns. Etching of the $SiO_2$ is preferably done using HF acid.

A distributed Bragg reflector (DBR) is then formed on a rear portion of the strained substrate by first depositing an approximately 5 micron wide, 1 to 3 micron thick, secondary film of $SiO_2$ over the channel previously formed on the rear end of the substrate. Next, a series of corrugations are formed on a 0.3 micron thick film of photoresist that has been deposited onto the secondary layer of $SiO_2$. Preferably, a photopolymer (e.g., Shipely holographic photoresist) is spin coated over the substrate. Then an Argon laser (488 nm line) is used to record and develop a grating in the photopolymer, with the grating wavevector oriented parallel to the waveguide. The photoresist is then developed and removed so as to yield the desired corrugations. The corrugations are typically on about 0.5 micron spacing.

Alternatively, the DBR can be fabricated directly on the substrate prior to the formation of the waveguide.

Next, four electrodes are formed adjacent to the channel. More particularly, a layer of Ni is vapor deposited onto the remaining $SiO_2$ material (i) adjacent to the distributed Bragg reflector corrugations, and (ii) adjacent to the front portion of the waveguide so as to form the mode puller. Low resistivity gold contact pads are then deposited onto each of the Ni electrodes so as to allow for bonding to external conductors.

Finally, a repoling voltage is applied in the same direction as the tuning voltage, i.e., substantially perpendicular to the channel of the waveguide. Repoling electric fields in the range of from about 6–8 kV/cm may be used, with about 7 kV/cm being preferred. The same electrodes may be used for both repoling of the substrate and for electro-optical mode selection.

EXAMPLE 2

By way of another example, a hybrid semiconductor laser may be formed according to this invention by first providing a substrate of $Pb_{(1-x)}La_x(Ti_{1-y}Zr_y)_{(1-(x/4))}O_3$ (PLZT) that is approximately 10 $mm^3$ in size. The substrate is then heated in a conventional oven to a temperature of about 300 degrees Celsius. A film of $SiO_2$ is deposited onto the heated substrate of PLZT by RF sputtering, under about 200 millitorr of oxygen pressure. The $SiO_2$ is deposited to an average thickness of approximately 1–2 microns along the top surface of the substrate. The substrate is then cooled to ambient temperature, e.g., about 20 degrees Celsius or so.

In order to form the constant strain contours within the substrate material, a channel is selectively etched away from a portion of the $SiO_2$ layer. More particularly, a photoresist is applied to the top surface of the $SiO_2$ and then patterned so as to leave a channel width of approximately 8 microns. Etching of the $SiO_2$ is preferably done using HF acid.

A distributed Bragg reflector (DBR) is then formed on a rear portion of the strained substrate by first depositing an approximately 5 micron wide, 1 to 3 micron thick, secondary film of $SiO_2$ over the channel previously formed on the rear end of the substrate. Next, a series of corrugations are formed on a 0.3 micron thick film of photoresist that has been deposited onto the secondary layer of $SiO_2$. Preferably, a photopolymer (e.g., Shipely holographic photoresist) is spin coated over the substrate. Then an Argon laser (488 nm line) is used to record and develop a grating in the photopolymer, with the grating wavevector oriented parallel to the waveguide. The photoresist is then bleached and removed so as to yield the corrugations. The corrugations are typically on about a 0.5 micron spacing. Alternatively, the DBR can be fabricated directly on the substrate prior to the formation of the waveguide. A PZT cap may then be applied over the top of the channel in order to compensate for the very high capacitance of the PLZT substrate.

Next, four electrodes are formed adjacent to the channel. More particularly, a layer of Ni is vapor deposited onto the remaining $SiO_2$ material adjacent to (i) the distributed Bragg reflector, and (ii) adjacent to the front portion of the waveguide so as to form the mode puller. Low resistivity gold contact pads are then deposited onto the Ni electrodes so as to allow for bonding to external conductors.

Finally, a repoling voltage is applied in the same direction as the tuning voltage, i.e., substantially perpendicular to the channel of the waveguide. Repoling electric fields in the range of from about 6–8 kV/cm may be used, with about 7 kV/cm being preferred. The same electrodes may be used for both repoling of the substrate and for electro-optical mode selection.

MODIFICATIONS

It should be appreciated that various modifications may be made to the preferred embodiments previously described without departing from the spirit and scope of the present invention.

For example, the tunable waveguide device described above may be utilized as a stand-alone, high-speed, narrow linewidth fiberoptic filter, rather than as part of a hybrid semiconductor laser.

Furthermore, in the foregoing description, the waveguide for external cavity 100 is described as being formed with a strain-induced technique. However, the waveguide for external cavity 100 could also be formed using other techniques. For example, waveguides can be formed in electro-optical materials by sandwiching thin films of these materials between two layers of material having lower indices of refraction. The entire thin film waveguides can then be deposited on a variety of different substrates using standard thin film deposition techniques, and then phase control means 110 and wavelength selection means 120 added, etc. so as to form the electro-optically tunable external cavity mirror.

Figure 12:
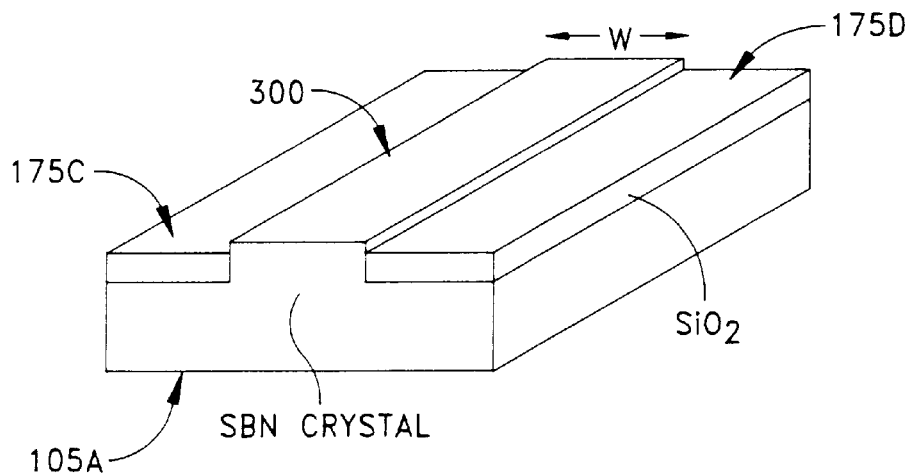
FIG. 12 is a schematic view of another type of waveguide formed in accordance with the present invention.

Another method for forming a strain-induced waveguide on an electro-optical substrate is shown in FIG. 12. In this method, a 2–4 micron high, and 5–10 micron wide, ridge 300 is formed on top of the electro-optic substrate 105A by dry etching or ion milling. Substrate 105A may comprise SBN:61, SBN:75, PLZT, or any other electro-optic material consistent with the present invention. $SiO_2$ strain layers 175C and 175D are then deposited on either side of the ridge 300 so as to exert uniform pressure on the ridge structure. This method not only induces uniform index of refraction in the electro-optic substrate material, but it also forms a larger index of refraction change. Following the deposition of $SiO_2$ layers 175C and 175D, electrodes such as ITO or gold are deposited on top of the $SiO_2$ layers 175C and 175D, e.g., in the manner previously described. Among other things, this fabrication method allows the application of a larger electric field uniformly across the waveguide because of a simpler geometry and a shorter electrical distance between electrodes.

Figure 13:
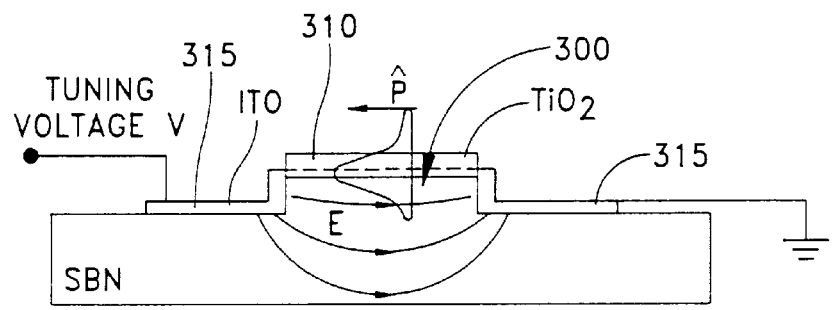
FIGS. 13 and 14 show yet another type of waveguide formed in accordance with the present invention.
Figure 14:
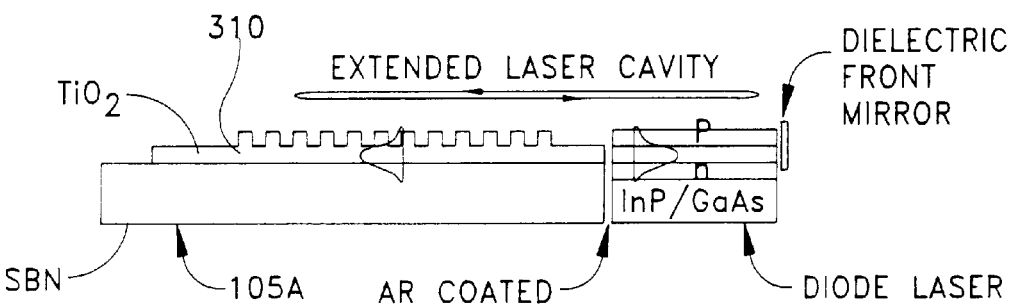

Another new method for fabricating a waveguide on an electro-optic substrate is shown in FIGS. 13 and 14. In this method, a DBR waveguide is formed by creating the ridge 300 on top of the electro-optic substrate 105A, and then depositing a thin film 310 on top of the ridge, but not on either side of the ridge. In this case, the deposited film 310 must have a larger index of refraction so as to form the waveguide core. Preferably, a passive (non-electro-optic) film 310 is deposited on the electro-optic substrate's ridge 300. Substrate 105A may comprise SBN:61, SBN:75, PLZT or any other material consistent with the present invention. Where substrate 105A comprises SBN, film 310 might comprise $TiO_2$ or ZnS, each of which has an index of refraction larger than SBN. After deposition, the film is formed into a strip waveguide by photolithography and chemical etching. In the next step, electrodes 315 are deposited on either side of the waveguide so as to allow electro-optic tuning. With this construction, electro-optic modulation occurs via electro-optic interaction with the evanescent tail of the optical mode that penetrates the SBN cladding.

Figure 15:
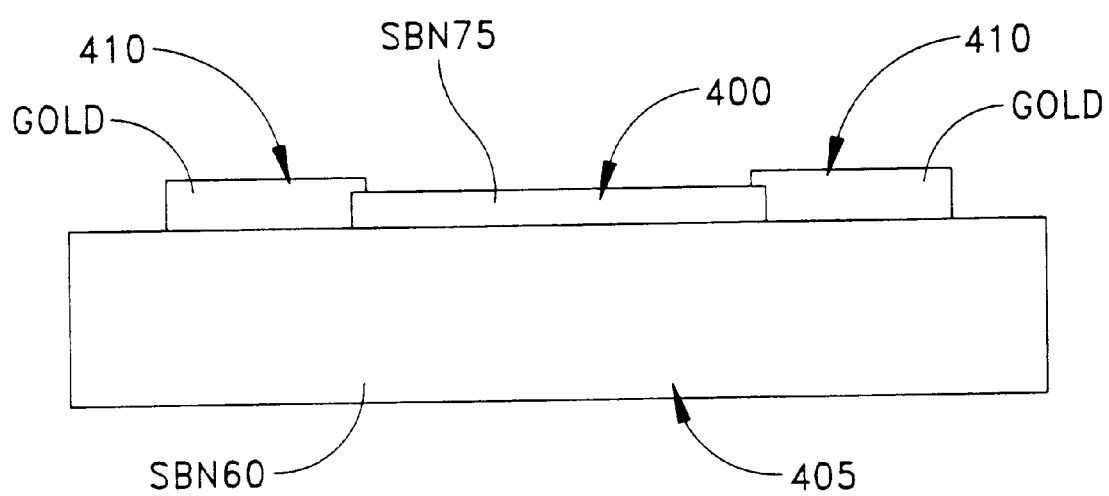
FIG. 15 shows still another type of waveguide formed in accordance with the present invention.

In FIG. 15, an alternative construction is shown in which an epitaxial waveguide is formed by the growth of an SBN:75 layer 400 on top of an SBN:60 layer 405. In this method, the larger index of refraction of SBN:75 ($n_1$=2.31217 and $n_3$=2.2981) compared to those of SBN:60 ($n_1$=2.31203 and $n_3$=2.2817) allows for the formation of a waveguide with SBN:75 as the waveguide core. In particular, the SBN:75 layer 400 is grown epitaxially on the SBN:60 layer 405, using excimer short pulse deposition under an oxygen atmosphere of 200 millitorr at 760 degrees Celsius, with high optical quality. The thickness of the waveguide must be on the order of 1.5 micron or thicker so as to allow above-cutoff waveguide formation. Following the deposition of SBN:75, a strip waveguide is formed by etching the SBN:75 into a strip (ridge) form and then depositing coplanar electrodes 410 on either side of the strip so as to allow for waveguide tuning. In this technique, since SBN:75 forms the core of the waveguide, large index changes can be achieved. A DBR may then be formed in the SBN:75 ridge waveguide by holographic recording of the desired grating on photoresist, followed by ion-milling technique.

It is also to be understood that the present invention is by no means limited to the particular constructions herein disclosed and shown in the drawings, but also comprises any modifications or equivalents within the scope of the claims.

What is claimed is:

1. A tunable external cavity waveguide device, said waveguide device comprising:
   a ferroelectric electro-optical substrate;
   a waveguide formed in said substrate;
   a distributed Bragg reflector (DBR) disposed adjacent a portion of said waveguide; and
   means for applying a voltage difference across said distributed Bragg reflector,
   wherein said substrate has an index of refraction, wherein said waveguide is formed in said substrate by inducing a strain field within said substrate, and wherein said strain field forms graduated variations in the index of refraction of said substrate without altering the chemical composition of said substrate.

2. A tunable external cavity waveguide device according to claim 1 wherein said substrate has an electro-optic coefficient of no less than $r_{33}$=240 pm/V and a strain-optic coefficient which is positive.

3. A tunable external cavity waveguide device according to claim 2 wherein said substrate has a strain-optic coefficient in the range of about 0.1.

4. A tunable external cavity waveguide device according to claim 3 wherein said substrate comprises $Sr_xBa_{(1-x)}Nb_2O_6$.

5. A tunable external cavity waveguide device according to claim 4 wherein said substrate comprises $Sr_{0.61}Ba_{0.39}Nb_2O_6$.

6. A tunable external cavity waveguide device according to claim 4 wherein said substrate comprises $Sr_{0.75}Ba_{0.25}Nb_2O_6$.

7. A tunable external cavity waveguide device according to claim 3 wherein said substrate comprises $Pb_{(1-x)}La_x(Ti_{(1-y)}Zr_y)_{1-(x/4)}O_3$.

8. A tunable external cavity waveguide device according to claim 3 wherein said substrate comprises $LiNbO_3$.

9. A tunable external cavity waveguide device according to claim 3 wherein said substrate comprises $LiTaO_3$.

10. A tunable external cavity waveguide device according to claim 3 wherein said substrate comprises $BaTiO_3$.

11. A tunable external cavity waveguide device according to claim 1 wherein said substrate comprises a ridge projecting out of a flat surface, and further wherein a layer of material is deposited onto said ridge, said layer of material having a larger index of refraction than said substrate.

12. A tunable external cavity waveguide device according to claim 1 wherein said substrate comprises a flat surface, and further wherein a layer of material is deposited onto said flat surface, said layer of material comprising a ferroelectric electro-optical material having a larger index of refraction than said substrate.

13. A tunable external cavity waveguide device according to claim 1 wherein said waveguide device further comprises phase control means for selecting a cavity mode.

14. A tunable external cavity waveguide device according to claim 13 wherein said phase control means comprise means for applying a voltage difference across a portion of said waveguide.

15. A tunable external cavity waveguide device according to claim 1 wherein said substrate has a non-zero strain-optic coefficient.

16. A tunable external cavity waveguide device according to claim 15 wherein said substrate has an electro-optic coefficient of no less than $r_{33}$=240 pm/V.

17. A tunable external cavity waveguide device according to claim 1 wherein said substrate has an index of refraction, wherein said waveguide is formed in said substrate by inducing a strain field within said substrate, and wherein said strain field forms graduated variations in the index of refraction of said substrate in such a way that the affected area has a different index of refraction than the remainder of said substrate, thereby forming an optical waveguide.

18. A tunable external cavity waveguide device according to claim 17 wherein said waveguide is formed in said substrate by inducing a compressive strain field within said substrate such that said affected area has a higher index of refraction than the remainder of said substrate.

19. A tunable external cavity waveguide device according to claim 1 wherein said strain field comprises a compressive strain field.

20. A tunable external cavity waveguide device according to claim 19 wherein said compressive strain field is formed in said substrate by depositing a layer of material on said substrate, said layer of material having a different coefficient of thermal expansion than said substrate, and said layer of material being applied to said substrate at an elevated temperature and then allowed to cool.

21. A tunable external waveguide device according to claim 20 wherein said substrate comprises a flat surface and said layer of material is deposited onto said flat surface, and further wherein a channel is formed in said layer of material after cooling.

22. A tunable external cavity waveguide device according claim 20 wherein said substrate comprises a ridge projecting out of a flat surface, and further wherein said layer of material is deposited onto said flat surface adjacent said ridge.

23. An external cavity mirror disposed relative to a semiconductor laser for directing a portion of the emitted laser light back into an optically active region of said semiconductor laser, said external cavity mirror comprising a substrate comprising a ferroelectric electro-optical material, a waveguide formed in said substrate, and an electro-optically tunable distributed Bragg reflector (DBR) formed on said substrate, wherein said portion of emitted laser light is directed back into said optically active region of said semiconductor laser as a function of a pre-determine external voltage difference that is selectively applied across said distributed Bragg reflector (DBR), wherein said substrate has an index of refraction, wherein said waveguide is formed in said substrate by inducing a strain field within said substrate, and wherein said strain field forms graduated variations in the index of refraction of said substrate without altering the chemical composition of said substrate.

24. An external cavity mirror according to claim 23 wherein said strain field comprises a compressive strain field.

25. A semiconductor laser comprising:

an active section which spontaneously emits light over a bandwidth around some center frequency;

an external cavity mirror bounding one end of said active section; and a partially reflective mirror bounding an opposite end of said active section;

said external cavity mirror being disposed relative to said active section for directing a selected portion of said light back into said active section, said external cavity mirror comprising a substrate comprising:

a ferroelectric electro-optical substrate;

a waveguide formed in said substrate;

a distributed Bragg reflector (DBR) formed on said substrate; and means for applying a voltage difference across said external cavity mirror, wherein said substrate has an index of refraction, wherein said waveguide is formed in said substrate by inducing a strain field within said substrate, and wherein said strain field forms graduated variations in the index of refraction of said substrate without altering the chemical composition of said substrate.

26. A semiconductor laser according to claim 15 wherein said strain field comprises a compressive strain field.

* * * * *